United States Patent [19]
Egan et al.

[11] Patent Number: 5,911,050
[45] Date of Patent: Jun. 8, 1999

[54] SYSTEM FOR CONNECTING EITHER OF TWO SUPPLY VOLTAGE TYPE PCI CARDS USING A COMMON CONNECTOR SOCKET

[75] Inventors: Patrick Kevin Egan; Jan Douglas Smid, both of Rochester, Minn.

[73] Assignee: International Business Machines Corporation, Armonk, N.Y.

[21] Appl. No.: 08/886,735

[22] Filed: Jul. 1, 1997

[51] Int. Cl.$^6$ .................................................. G06F 13/00
[52] U.S. Cl. ........................ 395/280; 395/281; 395/282; 395/308; 395/828; 395/882; 361/58; 439/59; 439/74; 439/680
[58] Field of Search .................................. 395/281, 282, 395/308, 828, 882; 361/58; 439/59, 680, 74

[56] References Cited

U.S. PATENT DOCUMENTS

| | | | |
|---|---|---|---|
| 5,421,734 | 6/1995 | MacWilliams | 439/59 |
| 5,611,057 | 3/1997 | Pecone et al. | 395/282 |
| 5,634,132 | 5/1997 | Pearce et al. | 395/750 |
| 5,708,799 | 1/1998 | Gafken et al. | 395/500 |
| 5,758,100 | 5/1998 | Odisho | 395/282 |

*Primary Examiner*—Ayaz R. Sheikh
*Assistant Examiner*—Frantz Blanchard Jean
*Attorney, Agent, or Firm*—Robert W. Lahtinen; Matthew J. Bussan

[57] ABSTRACT

A multiple supply voltage peripheral component interconnect (PCI) connector is disclosed which replaces connectors that are keyed for a specific signaling voltage. A single connector receives all current types of PCI keyed card edge connectors and supplies the correct signaling voltage thereto. The type of PCI card is identified and the appropriate signaling voltage is switched to the signaling power input (Vio) using industry standard conditions at selected pin locations rather than using unique keying of cards and connectors to assure a match between the signaling voltage required by the card and the signaling voltage supplied at the connector. As shown, detection and control circuitry senses the presence of grounded or open conditions at selected pin locations indicative of the type card present in the connector and switches the signaling power supply to the correct voltage source. Also, the connector is buffered to enable connection to a single logical PCI bus irrespective of the signaling voltage supplied to the card. Further, the buffered connectors can be replicated to enable numerous cards, with any mix of signaling voltages, to be attached to the single logical bus.

15 Claims, 7 Drawing Sheets

SYSTEM FOR CONNECTING EITHER OF TWO SUPPLY VOLTAGE TYPE PCI CARDS USING A COMMON CONNECTOR SOCKET

FIELD OF THE INVENTION

The present invention is directed to a connector for a circuit card and more particularly to a connector which receives and powers multiple signaling voltage types of peripheral component interconnect (PCI) cards.

BACKGROUND OF THE INVENTION

Peripheral component interconnect (PCI) is a common industry input-output (I/O) structure for connecting a selection of functions to a device, such as a computer, to tailor the system to the users requirements. The PCI bus provides a state of the art, industry standard high data rate, design of choice for many applications. PCI cards, used for attachment to the PCI bus, come in three types: +5 volt boards, +3.3 volt boards and dual voltage signaling boards. The systems that accept these cards can only power two types, +5 volt boards and dual voltage boards or +3.3 volt boards and dual voltage signaling boards. This because the signaling voltage (Vio) is fixed on the PCI card backplane to +5 volts or +3.3 volts, and the PCI connectors are keyed to accept only a card capable of using the hard wired voltage.

The environment wherein the PCI connectors that attach PCI cards to the PCI bus are of two keyed types, for either +3.3 volt or +5 volt cards, is not a problem when the connector is to receive a known voltage PCI card. However, when connectors are provided for future cards or optional function cards to be subsequently selected, the device designer must select the type of connector or the mix of connector types to be used. The connector selection can be further complicated since in the future the use of +3.3 volt cards is expected to be more prevalent than the currently more extensively used +5 volt cards.

SUMMARY OF THE INVENTION

The connector of the present invention is a multiple voltage PCI connector that accepts all three types of PCI cards defined by the current PCI standard. The connector has no keys or barriers, but presents a connector with pins at all pin positions and uses a detection and control circuit which senses the grounded and open conditions of a PCI card received in the connector at the specified pin positions called for by the industry standard.

In one mode, the detection and control circuit monitors pins 50 and 51. If one of these pins is found to be grounded, a +3.3 volt supply is connected to the signaling voltage of the card which is present in the connector. If both of the pins 50 and 51 are found to be open, a +5 volt supply is connected to the signaling voltage of the PCI card present in the connector. In this environment, the 5 volt supply is the default signaling voltage that is supplied to a dual voltage PCI card. In an alternative mode of operation, the detect and control circuit monitors pin locations 12 and 13. If one of pins 12 and 13 is found to be grounded, the +5 volt supply is connected to the signaling voltage of the PCI card present in the connector and if both of the pins 12 and 13 are open, a +3.3 volt supply is connected to the signaling voltage of the PCI card present in the connector. In the alternative mode of operation, the +3.3 volt supply is the default signaling voltage that is supplied to a dual voltage PCI card.

This invention also requires that each slot has an independent voltage, so that one card can have 5 volt signaling and the card next to it have 3.3 volt signaling. This requires separate PCI buses to each slot or that a common bus is redriven or buffered for each slot so that independent signaling voltages can be used.

BRIEF DESCRIPTION OF THE DRAWINGS

FIG. 3 schematically illustrates the three types of PCI card edge connectors wherein

FIG. 4 schematically shows plan views of the standard keyed PCI connectors wherein

The detect and control circuit of FIG. 7 is similar to that of FIG. 6, but monitors different pin locations, resulting in a 3.3 volt default voltage that is supplied to a dual voltage card positioned in the connector.

DETAILED DESCRIPTION

The PCI standard calls for a card received in a PCI slot to be powered by +3.3 and +5 volt supplies. However, the signaling voltage (Vio) may be either +3.3 or +5 volts which has required that connector slots and card edge connectors be keyed to prevent card insertion into a slot that supplies the wrong signaling voltage. Subsequent references herein to 3.3 volt PCI cards or 5 volt PCI cards refer to cards requiring signaling voltages of +3.3 volts and +5 volts respectively.

Figure 1:
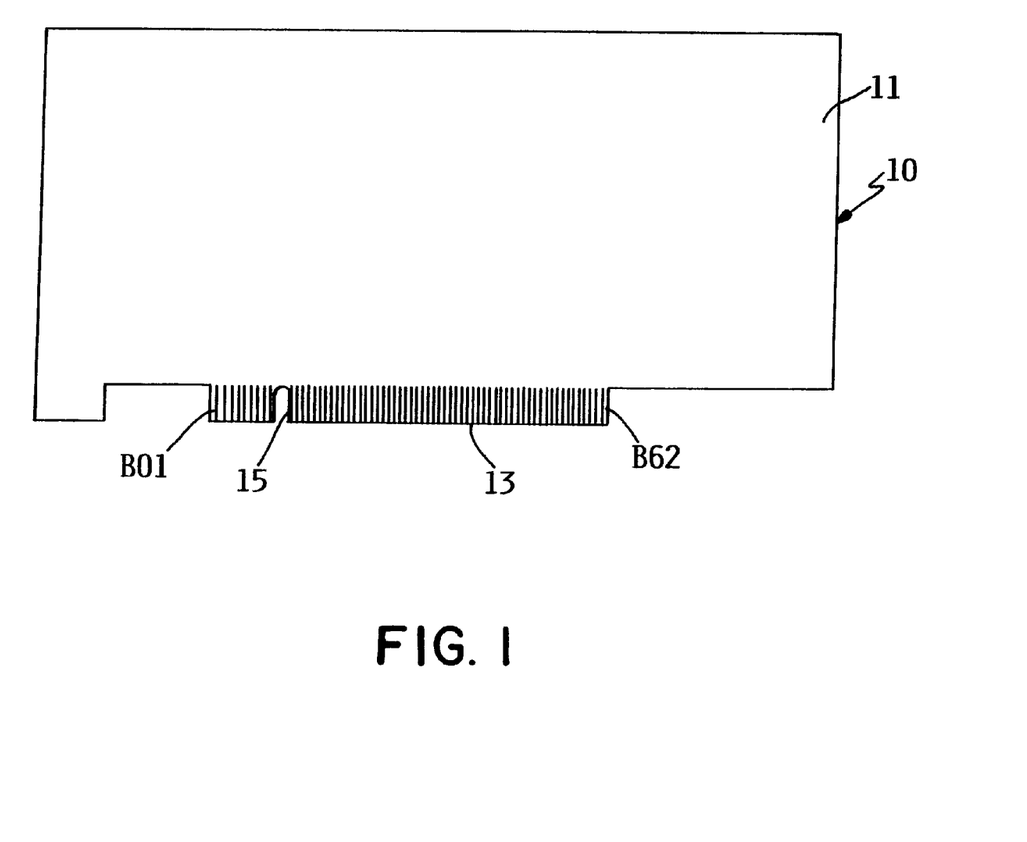
FIG. 1 is a view of the 'B' or component side of a current PCI short card keyed to receive a PCI card which uses a 3.3 volt power supply.
Figure 2:
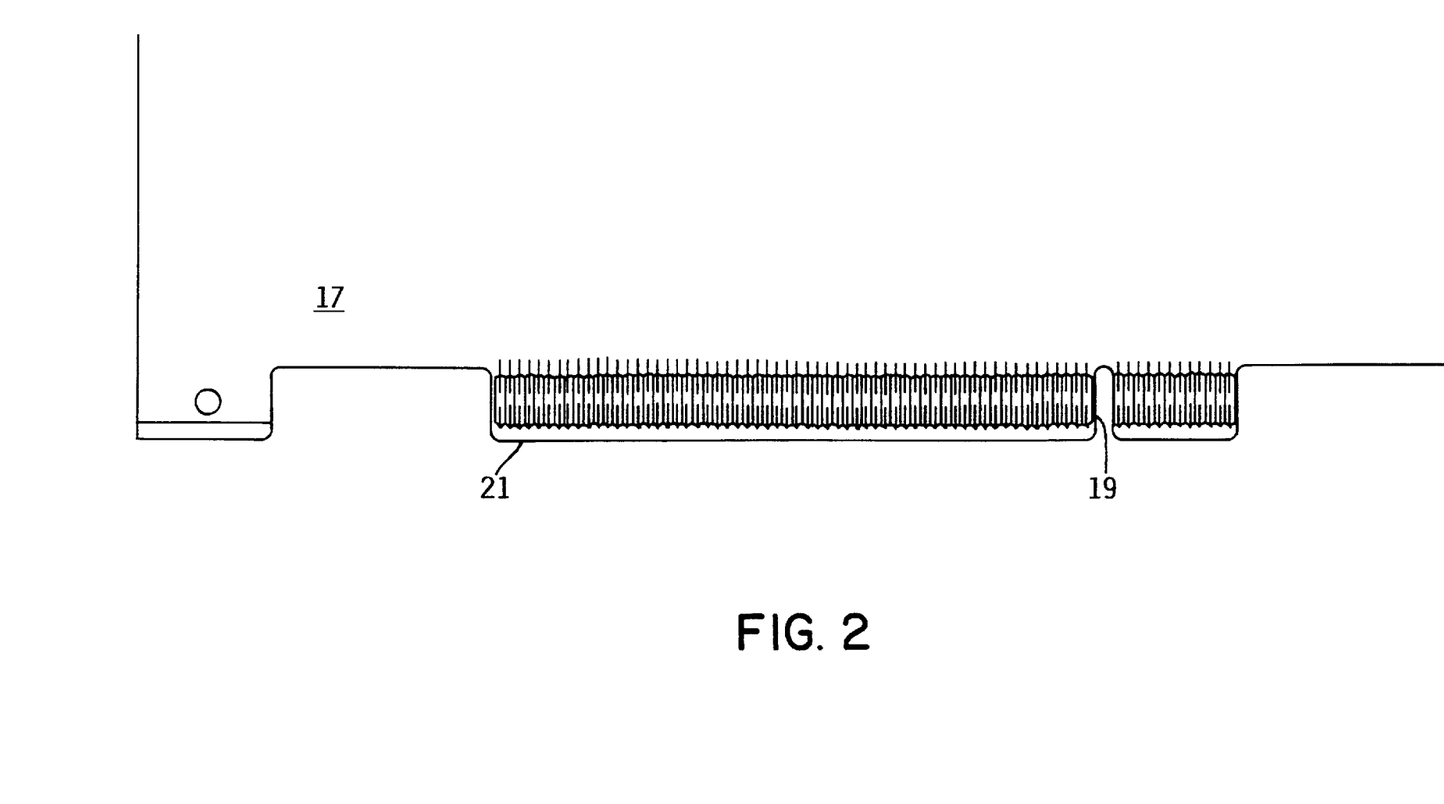
FIG. 2 is a partial view of a PCI card similar to that of FIG. 1, but with the edge connector keyed to receive a PCI card that utilizes a +5 volt power supply.

The industry standard for peripheral component interconnect (PCI) defines three types of PCI cards and two PCI connectors. FIG. I illustrates a standard +3.3 volt PCI short card 10 with the component or B side 11 visible. The edge connector 13 includes positions for 62 contact pads (B01 to B62) on the 'B' side with a like number of pads aligned on the opposite or 'A' side of the edge connector. The edge connector includes a slot or keyway 15 where pads 12 and 13 would otherwise be positioned to enable the edge connector to be received in a +3.3 volt connector which includes a key at the positions of pins 12 and 13 to prevent the insertion of a 5 volt PCI card. A further element of the 3.3 volt PCI card standard calls for the edge connector pads 50 and 51 to be grounded. FIG. 2 is an enlarged view, similar to a portion of FIG. 1, showing a portion of a standard +5 volt PCI card 17 wherein the notch or key 19 is positioned at the location of pads 50 and 51 to enable the edge connector 21 to be received in a 5 volt PCI connector which includes a key or blockage at the location of connector pins 50 and 51. The key 19 at pin locations 50 and 51 prevents the mounting of a 3.3 volt card in a 5 volt connector. The 5 volt PCI card 17 built in accordance with the industry standard has the contact pads 12 and 13 grounded. The third type of PCI card is a dual voltage card which includes an edge connector wherein notches or keys are positioned at both the location of pads 12 and 13 and the location of pads 50 and 51 to enable the card to be received in either a 3.3 volt or a 5 volt connector.

Figure 3A:
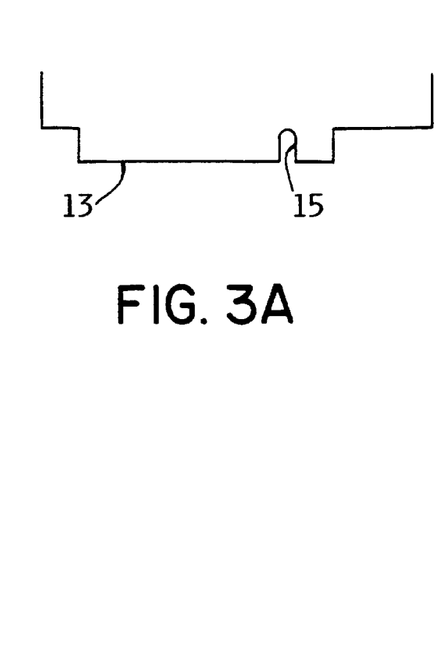
FIG. 3A illustrates a 5 volt (card.
Figure 3B:
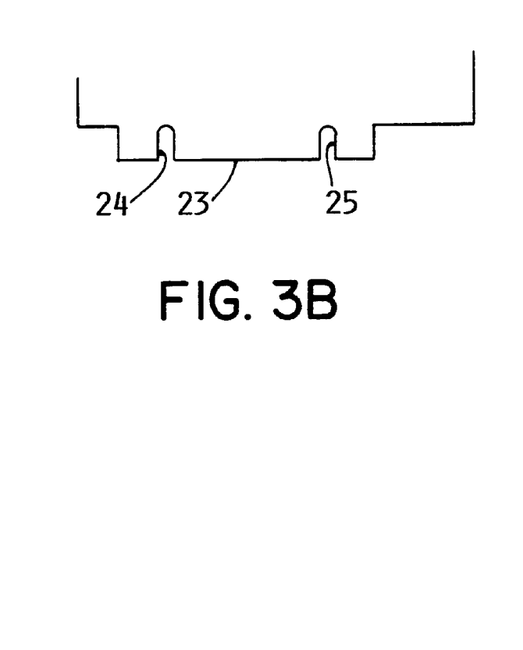
FIG. 3B, a dual voltage card.
Figure 3C:
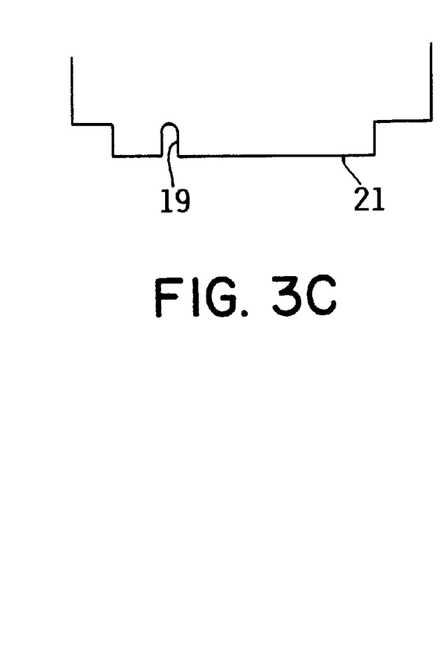
FIG. 3C a 3.3 volt card.
Figure 4A:
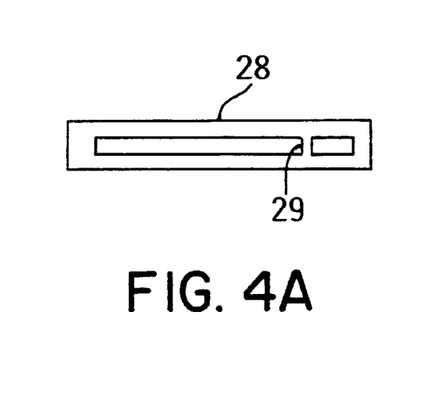
FIG. 4A is a 3.3 volt PCI card connector
Figure 4B:
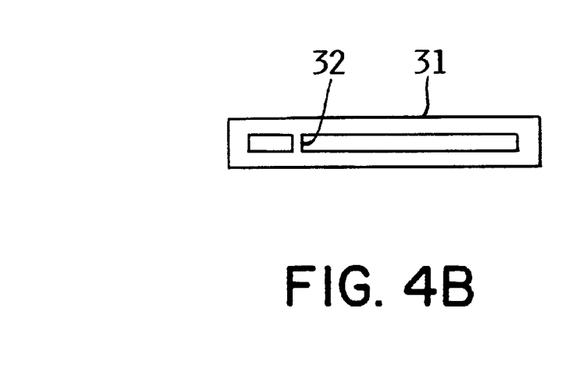
FIG. 4B is a 5 volt PCI card connector.

FIG. 3 shows the 'B' sides of PCI card edge connectors of standard PCI cards including a 5 volt card A with an edge connector 13 and notch or key 15, a 3.3 volt card C including edge connector 21 with a notch or key 19, and a dual voltage card B with an edge connector 23 that includes both key 24 at the position of pads 12, 13 and a key at the position of pads 50, 51. Top views of the two industry standard PCI connectors are shown in FIG. 4. FIG. 4A illustrates the 5 volt PCI connector 28 with a key or blockage 29 formed at the position of pins 50 and 51. FIG. 4B shows a 3.3 volt connector 31 wherein the key or blockage 32 is positioned at the location of pins 12 and 13. The dual voltage PCI card which will function when powered by either a 3.3 or 5 volt power supply and includes the edge connector 23 of FIG. 3B may be inserted into either of the two industry standard connectors 28 or 31 of FIG. 4.

Figure 5:
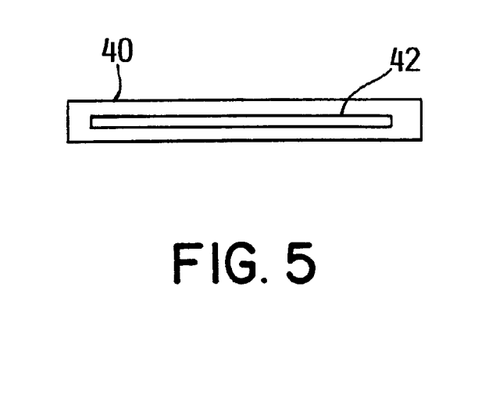
FIG. 5 illustrates the 'B' or component side of a PCI card incorporating the edge connector used with the present invention.

FIG. 5 shows a plan view of the PCI connector 40 in which the edge connector of any of the PCI cards of FIG. 3 can be received. This connector 40 has no keys or barriers and presents a continuous slot 42 with pins at all 62 pin locations at each side of a card edge connector inserted therein. Thus the connector can receive any of the three current industry standard edge connector configurations, as shown in FIG. 1, FIG. 2 and FIG. 3.

Figure 6:
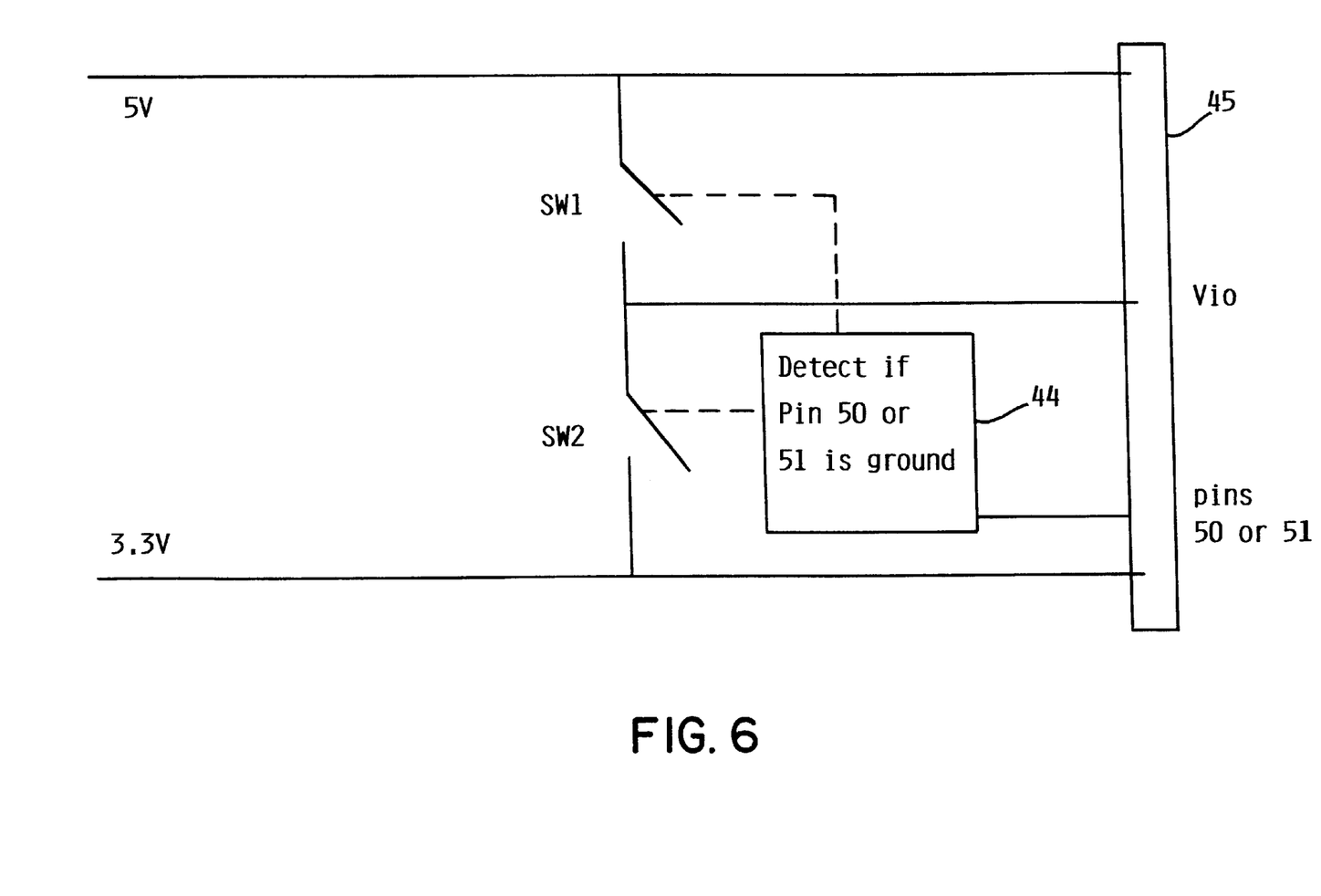
FIG. 6 shows the detect and control circuit associated with the PCI connector of the present invention wherein 5 volts is the default voltage supplied to a dual voltage PCI card positioned in the connector.
Figure 7:
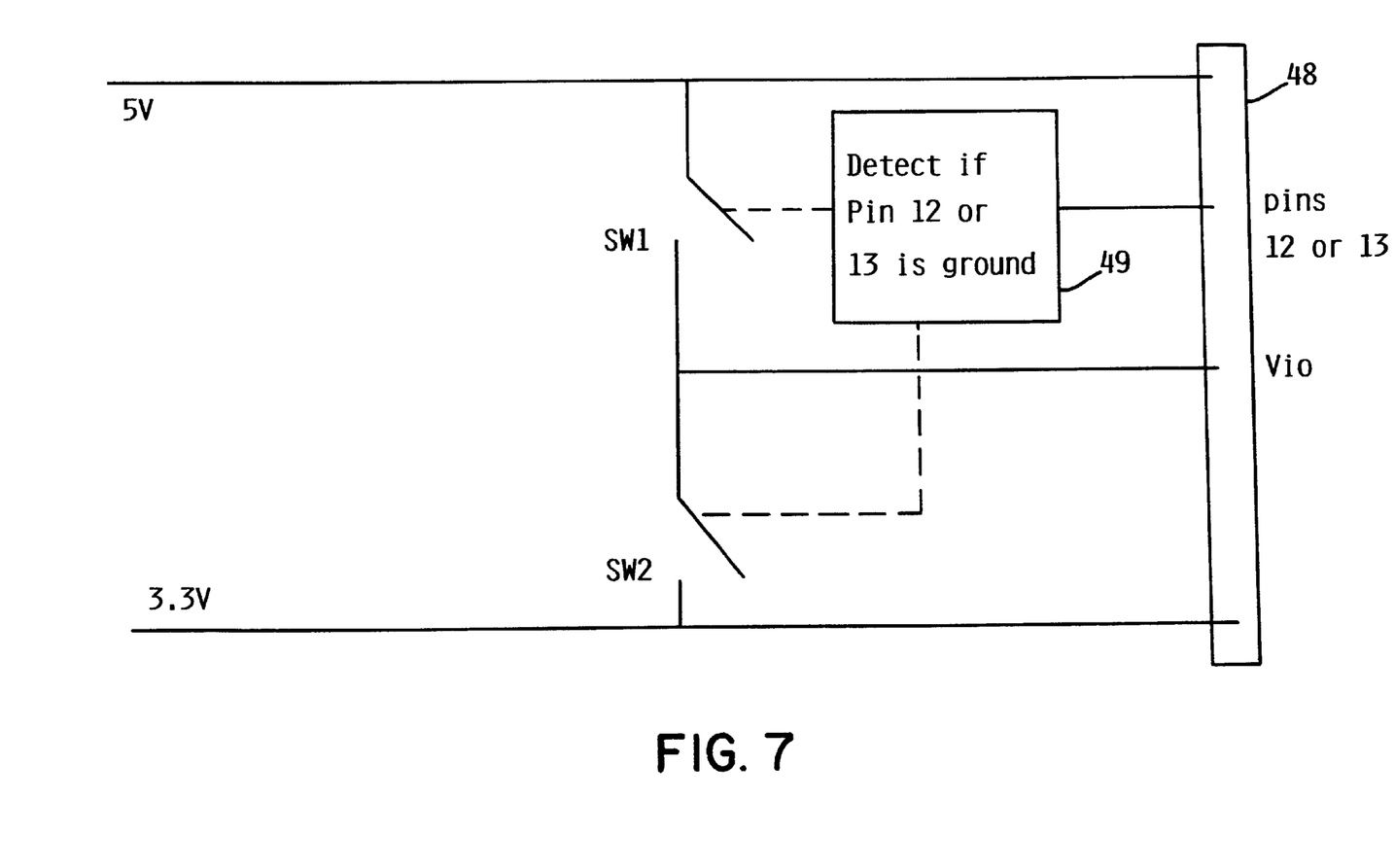

As can be seen in FIGS. 6 and 7, each card received in a connector to the PCI bus is supplied with both 3.3 and 5 volt power. However, the signaling voltage supplied on line Vio is either 3.3 or 5 volts as required by the individual PCI card. To discriminate between the signaling voltages the PCI standard uses card edge and connector keys. The card edge connector configurations are show in FIG. 3. Using the present invention, the conditions at selected pin locations, in accordance with the PCI standard, identify the inserted card as being a 3.3 volt card or a 5 volt card.

The correct supply voltage Vio that is to be provided to the PCI card is determined by monitoring pins 50, 51 as illustrated in the circuit of FIG. 6 or by monitoring pins 12, 13 as illustrated in the circuit of FIG. 7. In FIG. 6, the power supplied to the PCI connector is controlled by a detect and control circuit 44 that monitors pins 50 and 51 and functions to close either switch SW1 to supply a PCI card mounted in connector 45 with +5 volts on the power input supply Vio or to close switch SW2 to supply a PCI card mounted in connector 45 with +3.3 volts on the input power supply Vio. Detection circuit 44 determines whether Pins 50 or 51 are grounded. If pins 50 or 51 are found to be grounded, a 3.3 volt card has been detected and switch SW2 is closed to make Vio +3.3 volts. If detect circuit 44 finds pins 50 and 51 to be open, switch SW1 is closed to make Vio +5 volts since the card present in the connector 45 has been identified as either a 5 volt card or a dual voltage card. Thus a +5 volt Vio is the default supply voltage for the dual voltage signaling PCI card. In FIG. 7, the power supplied to a PCI connector 48 is controlled by detect circuit 49 that functions to close either switch SW1 to supply a PCI card mounted in connector 48 with 5 volts on the input power supply Vio or switch SW2 to supply a PCI card mounted in connector with a 3.3 volt on the input power supply Vio. Detection circuit 49 monitors pins 12 and 13 to determine whether pins 12 or 13 are grounded. If pins 12 or 13 are found to be grounded, a +5 volt card has been identified and switch SW1 is closed to connect Vio to the +5 volt power source. Should detect circuit find pins 12 and 13 to be open, switch SW2 is closed to connect Vio with a +3.3 volt supply since either a 3.3 volt card or a dual voltage card is present. Thus, using the circuit of FIG. 7, the default voltage for a dual voltage signalling PCI card is +3.3 volts. Although switches SW1 and SW2 of FIGS. 6 and 7 are schematically shown as separate devices, the electrical control is such that pursuant to any sensed condition, one and only one of the switches is closed. The control is exercised by a device such as an electrical latch wherein one switch is closed and the other is open when the latch is set and the conditions of the switches are reversed when the latch is in a reset condition.

This invention also requires that each card slot in the system have an independent bus that can select the signaling voltage. A normal PCI based system has eight cards on a signal bus and only one signaling voltage can be used. This invention requires that each slot have an independent bus for each slot. This can be done at least two ways.

The first way is for each slot to have its own PCI bus, such that an eight card system would have eight PCI buses. The second method is to redrive or buffer the PCI slots. Using this approach, there would still be only one logical PCI bus, but each slot would be buffered or redriven so that the card could determine the signaling voltage of the redriven bus. In most environments this would be the best method.

Figure 8:
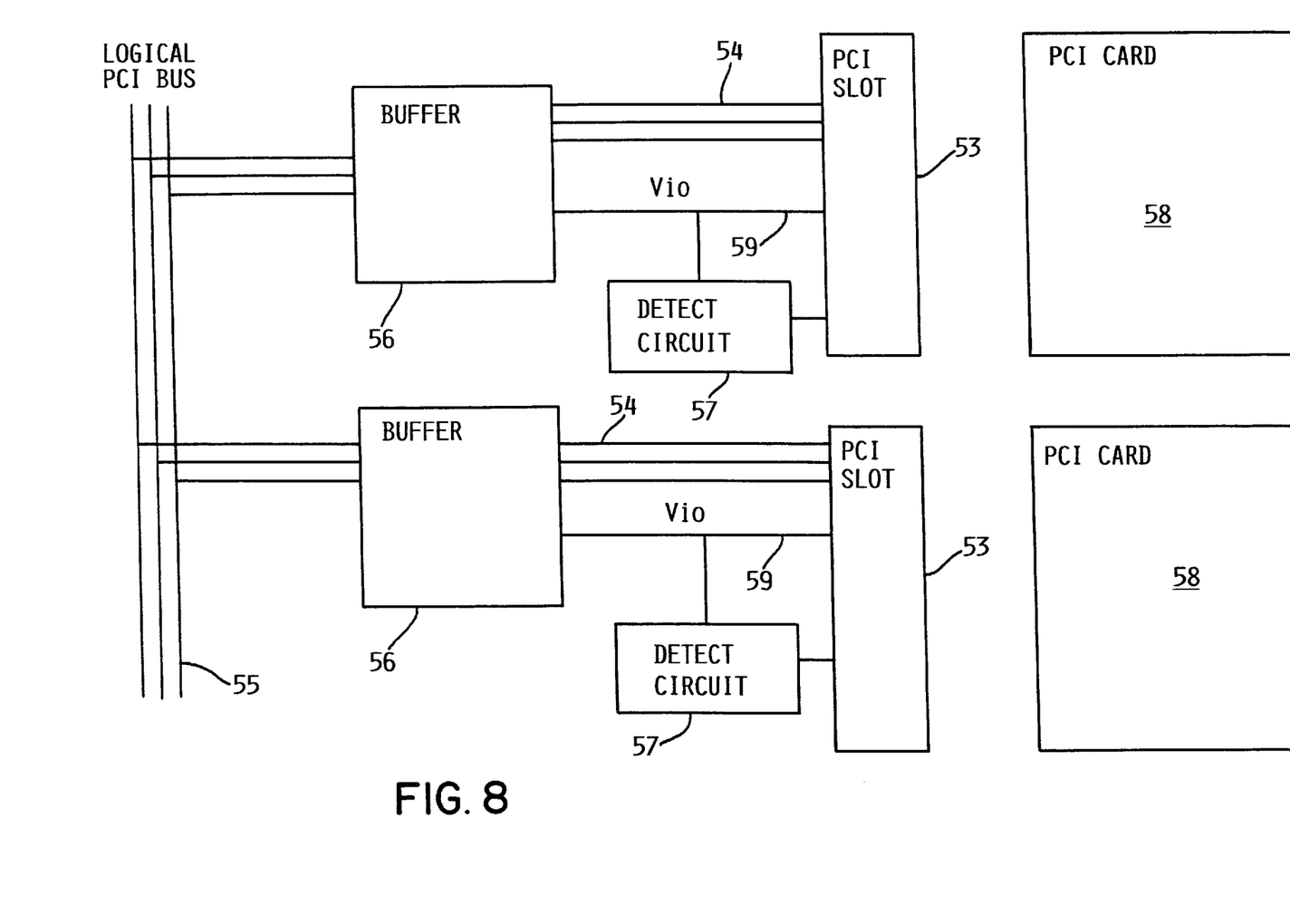
FIG. 8 is a schematic view of the embodiment of the invention wherein each PCI slot or socket is buffered to permit attachment of multiple slots to one logical PCI bus.

FIG. 8 illustrates a buffered PCI slot configuration. Each PCI slot 53 is connected to a buffered PCI bus 54 which connects to the single logical PCI bus 55 through buffer 56. Detect circuit 57 detects the open or grounded conditions at selected slot pin locations to detect which signaling voltage type PCI card 58 is resident in the connector slot 53 and connects the proper Vio signaling voltage to the card on line 59. The use of buffered PCI slots is not necessarily used solely to practice the present invention. The use of buffered PCI slots is a common practice which enables servicing of the system by permitting cards to be removed and installed without shutting down the common logical PCI bus. Thus, in many systems the present invention can be practiced solely through the addition of the detection and switching circuitry. Further, it will be appreciated that the buffered PCI slot circuits may be replicated to afford the required number of PCI card slots or to the number that will be supported under the PCI standard. Commonly, eight buffered slots are provided.

While the invention has been shown and described with reference to preferred embodiments thereof, it will be understood by those skilled in the art that various changes in form and details may be made therein without departing from the spirit and scope of the invention.

What is claimed is:

1. Apparatus for connecting a PCI logical bus to a PCI electronic card which uses one of a first and second power supply voltages and includes an edge connector keyed by a slot at a predetermined terminal contact location to assure that the correct one of said first and second power supply voltages is supplied to the signaling voltage input (Vio) of the card comprising a connector socket including terminal contacts and configured to receive a PCI card with an edge connector keyed to receive either of said first and second power supply voltages in accordance with the PCI standard;

attachment means for electrically connecting said connector socket with said PCI logical bus; and detection circuit means for sensing conditions at one of said predetermined connector socket terminal contact locations and connecting Vio to the correct one of said first and second power supply voltages.

2. The apparatus for connecting a PCI logical bus to a PCI electronic card of claim 1 wherein said attachment means includes a buffer connected to said PCI logical bus and a redriven PCI bus extending between said buffer and said socket, whereby a PCI card received by said connector socket determines the signaling voltage of said redriven PCI bus.

3. The apparatus for connecting a PCI logical bus to a PCI electronic card of claim 2 wherein the combination of said connector socket, said attachment means and said detection circuit means is replicated a number of times which is equal to the number of connector sockets to be attached to said PCI logical bus.

4. The apparatus for connecting a PCI logical bus to a PCI electronic card of claim 2 wherein said PCI card edge connector is slotted at pin positions 12 and 13 to designate when a 3.3 volt supply may be used and is slotted at pin positions 50 and 51 to identify when a 5 volt supply may be used and said detection circuit means determines whether a grounded or open state exists at terminal contacts 12 and 13 of said connector socket.

5. The apparatus for connecting a PCI logical bus to a PCI electronic card of claim 2 wherein said PCI card edge connector is slotted at pin positions 12 and 13 to designate when a 3.3 volt supply may be used and is slotted at pin positions 50 and 51 to identify when a 5 volt supply may be used and said detection circuit means determines whether a grounded or open condition exists at terminal contact 50 and 51 of said connector socket.

6. Apparatus for connecting a bus to an electronic card, which has an edge connector, to enable the correct one of two supply voltages to be supplied to the card and wherein the card is slotted at a predetermined edge connector location indicative of the supply voltage that may be used to energize the card electronic circuits comprising
- a connector socket, including terminal contacts and configured to receive card edge connectors slotted for either of said two supply voltages;
- attachment means for electrically connecting said connector socket to said bus; and
- detection circuit means connected to the socket terminal contacts associated with the card edge connector contacts at the slot location associated with one of the two supply voltage card types, which connects the card to the other of said two supply voltages when a predetermined electrical condition is found and connects the card to said one of said supply voltages when an open circuit is found.

7. The apparatus for connecting a bus to an electronic card of claim 6 wherein said electrical condition is a grounded circuit.

8. The apparatus for connecting a bus to an electronic card of claim 7 wherein said apparatus includes a plurality of connector sockets for respectively attaching a plurality of cards to a common bus and said attachment means includes a buffer connected to said common bus and a redriven bus extending between said buffer and said connector socket, whereby a card resident in said connector socket determines the signaling voltage of said redriven bus.

9. The apparatus for connecting a bus to an electronic card of claim 8 wherein said common bus is a PCI bus, said redriven bus is a PCI bus and said connector socket is configured to accept any signaling voltage type PCI card keyed in accordance with the PCI standard.

10. The apparatus for connecting a bus to an electronic card of claim 9 wherein said card is a PCI card with said edge connector slotted at pin positions 12 and 13 to designate when a 3.3 volt supply may be used and is slotted at pin positions 50 and 51 to identify when a 5 volt supply may be used and said detection circuit means determines whether a grounded or open state exists at terminal contacts 12 and 13 of said connector socket.

11. The apparatus for connecting a bus to an electronic card of claim 9 wherein said card is a PCI card with said edge connector slotted at pin positions 12 and 13 to designate when a 3.3 volt supply may be used and is slotted at pin positions 50 and 51 to identify when a 5 volt supply may be used and said detection circuit means determines whether a grounded or open state exists at terminal contacts 50 and 51 of said connector socket.

12. In an apparatus to which devices are attached using card edge connectors wherein first and second card types respectively requiring first and second supply voltages are utilized and the card supply voltage is identified by a slot in the edge connector at respective first and second pin locations which enables the edge connector to be received in a socket with a web in a respective one of said first and second pin locations such that the socket presents the supply voltage required by the card, a common connector system that receives card edge connectors requiring either said first or second supply voltage comprising
- a card connector presented by said apparatus which receives card edge connectors with either said first or second supply voltage requirement;
- an input supply line that connects the input voltage to a card mounted in said card connector; and
- detection circuit means which senses the circuit condition at the connector pin locations of the slot associated with one of the first and second card types, where if a grounded condition exists the card is of the other of said card types and the other of said first and second voltages is connected to said input supply line and if an open circuit is found, the supply voltage associated with said one of said card types is connected to said input line, since either a card of said one type is installed in the connector or no card is installed or a card that accepts either of said first or second voltages is installed in the connector.

13. The apparatus of claim 12 wherein said devices are PCI cards and said apparatus includes a plurality of card connectors and a common PCI bus with each of said plurality of card connectors connected to said common PCI bus by a buffer and a redriven PCI bus.

14. The apparatus of claim 18 for connecting a PCI common bus to a PCI card wherein said PCI card edge connector is slotted at pin positions 12 and 13 to designate when a 3.3 volt supply may be used and is slotted at pin positions 50 and 51 to identify when a 5 volt supply may be used and said detection circuit means determines whether a grounded or open circuit condition exists at terminal contacts 12 and 13 of said card connector.

15. The apparatus of claim 13 for connecting a PCI common bus to a PCI card wherein said PCI card edge connector is slotted at pin positions 12 and 13 to designate when a 3.3 volt supply may be used and is slotted at pin positions 50 and 51 to identify when a 5 volt supply may be used and said detection circuit means determines whether a grounded or open circuit condition exists at terminal contacts 50 and 51 of said card connector.

* * * * *